United States Patent
Kim et al.

(10) Patent No.: US 10,770,536 B2
(45) Date of Patent: Sep. 8, 2020

(54) FLEXIBLE DISPLAY APPARATUS

(71) Applicant: Samsung Display Co., Ltd., Yongin-si, Gyeonggi-do (KR)

(72) Inventors: Cheolkyu Kim, Yongin-si (KR); Gwangbum Ko, Yongin-si (KR); Sangkyu Choi, Yongin-si (KR); Sangyoun Han, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/261,384

(22) Filed: Sep. 9, 2016

(65) Prior Publication Data

US 2017/0141179 A1    May 18, 2017

(30) Foreign Application Priority Data

Nov. 18, 2015    (KR) .................. 10-2015-0161726

(51) Int. Cl.
*H01L 27/32* (2006.01)
*H01L 51/00* (2006.01)

(52) U.S. Cl.
CPC ........ *H01L 27/3279* (2013.01); *H01L 27/323* (2013.01); *H01L 51/0097* (2013.01); *H01L 2251/5338* (2013.01)

(58) Field of Classification Search
CPC ......... H01L 2924/0002; H01L 2924/00; H01L 2251/5338; H01L 23/4985; H01L 27/3276; H01L 51/0097; H01L 51/5203; G02F 1/133305; G02F 1/134309; G02F 1/134363; G02F 1/13452; G02F 1/136286; G02F 2001/136

USPC ................. 257/40, 72; 349/96; 438/23
See application file for complete search history.

(56) References Cited

U.S. PATENT DOCUMENTS

| | | | | |
|---|---|---|---|---|
| 8,614,545 B2* | 12/2013 | Miyashita | ........... | H01L 27/3211 313/504 |
| 8,617,920 B2* | 12/2013 | Yamazaki | ......... | H01L 21/02554 257/43 |
| 9,195,108 B2* | 11/2015 | Park | .................. | G02F 1/136286 |
| 2014/0042406 A1* | 2/2014 | Degner | ............... | H01L 27/3297 257/40 |
| 2014/0184991 A1* | 7/2014 | Lan | .................... | G02F 1/134309 349/96 |
| 2014/0217373 A1* | 8/2014 | Youn | .................... | H05K 1/0281 257/40 |
| 2014/0232956 A1* | 8/2014 | Kwon | ............... | G02F 1/133305 349/12 |

(Continued)

FOREIGN PATENT DOCUMENTS

JP     2009-76576      4/2009
KR   10-2006-0078549 A   7/2006

(Continued)

*Primary Examiner* — Edward Chin
(74) *Attorney, Agent, or Firm* — Lewis Roca Rothgerber Christie LLP (57) ABSTRACT

A flexible display apparatus includes: a flexible substrate including a bending area and a non-bending area; and a wiring line extending across the bending area. The bending area is configured to bend along a bending axis, and a portion of the wiring line at the bending area includes a plurality of recessed portions recessed in a width direction of the wiring line.

17 Claims, 8 Drawing Sheets

(56) References Cited

U.S. PATENT DOCUMENTS

| | | | | |
|---|---|---|---|---|
| 2015/0234431 | A1* | 8/2015 | Jung | G06F 1/1643 |
| | | | | 349/12 |
| 2016/0093685 | A1* | 3/2016 | Kwon | H01L 51/5237 |
| | | | | 257/40 |
| 2016/0111485 | A1* | 4/2016 | Chida | H01L 27/3276 |
| | | | | 257/40 |

FOREIGN PATENT DOCUMENTS

| | | |
|---|---|---|
| KR | 10-2014-0087499 A | 7/2014 |
| KR | 10-2014-0099164 A | 8/2014 |

* cited by examiner

FLEXIBLE DISPLAY APPARATUS

CROSS-REFERENCE TO RELATED APPLICATION

This application claims priority to and the benefit of Korean Patent Application No. 10-2015-0161726, filed on Nov. 18, 2015 in the Korean Intellectual Property Office, the disclosure of which is incorporated herein in its entirety by reference.

BACKGROUND

1. Field

One or more embodiments relate to a flexible display apparatus.

2. Description of the Related Art

As electronic technology has advanced, various types of display apparatuses have been developed. In particular, display apparatuses, such as TVs, PCs, laptop computers, tablet PCs, mobile phones, and MP3 players, are used in most households. In order to meet recent desires of users, attempts to develop flexible display apparatuses have been made. Because shapes of flexible display apparatuses may be changed when users apply forces to the flexible display apparatuses, the flexible display apparatuses may be used for various purposes.

However, a flexible display apparatus may have low mechanical durability and may be easily damaged by a force applied by a user. Also, when a relatively stiff or rigid material is used to increase the mechanical durability of the flexible display apparatus, flexibility of the flexible display apparatus is reduced or limited. Accordingly, there is a desire to provide a flexible display apparatus having increased mechanical durability without substantially reducing the flexibly thereof.

SUMMARY

In a conventional flexible display apparatus, stress concentrates in wiring lines disposed at a bending area of the flexible display apparatus.

One aspect of embodiments of the inventive concept is a flexible display apparatus including a bending area having relatively high flexibility. However, this aspect is exemplary, and the scope of the inventive concept is not limited thereto.

Additional aspects will be set forth, in part, in the description which follows and, in part, will be apparent from the description or may be learned by practice of the presented embodiments.

According to one or more embodiments, a flexible display apparatus includes: a flexible substrate including a bending area and a non-bending area; and a wiring line extending across the bending area. The bending area being configured to bend along a bending axis, and a portion of the wiring line at the bending area includes a plurality of recessed portions recessed in a width direction of the wiring line.

The bending axis may extend in a first direction, and the wiring line may extend in a second direction that crosses the first direction.

The first direction and the second direction may be perpendicular to each other.

The wiring line may have a central axis that extends in a second direction, and the plurality of recessed portions may be on both sides of the wiring line about the central axis.

The plurality of recessed portions may include a plurality of first recessed portions that are on one side of the wiring line about the central axis and a plurality of second recessed portions that are on another side of the wiring line about the central axis. The first recessed portions and the second recessed portions may be alternately arranged along the second direction.

The wiring line may have a first width, and a recessed depth of each of the plurality of recessed portions may be less than half the first width.

A width of each of the plurality of recessed portions may be less than a recessed depth of each of the plurality of recessed portions.

The wiring line may have a central axis that extends in a second direction, the plurality of recessed portions may be on both sides of the wiring line about the central axis, and a minimum distance between adjacent ones of the recessed portions on one side of the wiring line from among the plurality of recessed portions may be greater than four times a recessed depth of each of the plurality of recessed portions.

The wiring line may have a first width and a central axis that extends in a second direction, the plurality of recessed portions may be on both sides of the wiring line about the central axis, and a minimum distance between adjacent ones of the recessed portions on one side of the wiring line from among the plurality of recessed portions may be greater than two times the first width.

The plurality of recessed portions may have polygonal shapes, elliptical shapes, circular shapes, partial polygonal shapes, partial elliptical shapes, or partial circular shapes.

The flexible display apparatus may further include a sensor configured to sense an external touch, and the wiring line may be on a same layer as the sensor.

The wiring line may be electrically connected to the sensor.

The wiring line may be located outside the sensor.

BRIEF DESCRIPTION OF THE DRAWINGS

These and/or other aspects will become apparent and more readily appreciated from the following description of embodiments, taken in conjunction with the accompanying drawings, in which.

DETAILED DESCRIPTION

The inventive concept may include various embodiments and modifications, and exemplary embodiments thereof will be illustrated in the drawings and will be described herein in detail. The aspects and features of the inventive concept and the accompanying methods thereof will become apparent from the following description of exemplary embodiments, taken in conjunction with the accompanying drawings.

However, the inventive concept is not limited to the exemplary embodiments described below and may be embodied in various forms.

Reference will now be made, in detail, to embodiments, examples of which are illustrated in the accompanying drawings. In the drawings, the same elements are denoted by the same reference numerals, and a repeated explanation thereof may not be given.

It will be understood that although the terms "first," "second," etc. may be used herein to describe various elements, these elements should not be limited by these terms. These elements are only used to distinguish one element from another. As used herein, the singular forms "a" and "an" are intended to include the plural forms as well, unless the context clearly indicates otherwise.

It will be further understood that the terms "includes," "including," "comprises," and/or "comprising" used herein specify the presence of stated features or components but do not preclude the presence or addition of one or more other features or components. It will be understood that when a layer, region, or element is referred to as being "on" or "formed on" another layer, region, or element, it can be directly or indirectly on the other layer, region, or element. For example, intervening layers, regions, or elements may also be present.

It will be understood that when an element or layer is referred to as being "on," "connected to," or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Further, the use of "may" when describing embodiments of the present invention relates to "one or more embodiments of the present invention." Also, the term "exemplary" is intended to refer to an example or illustration. As used herein, the terms "use," "using," and "used" may be considered synonymous with the terms "utilize," "utilizing," and "utilized," respectively.

Sizes of elements may be exaggerated for convenience of explanation. In other words, because sizes and thicknesses of elements in the drawings may be arbitrarily illustrated for convenience of explanation, the following embodiments are not limited thereto.

In the following examples, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be different from the described order. For example, two consecutively described processes may be performed substantially at the same time (e.g., concurrently) or may be performed in an order opposite to the described order.

As used herein, the term "and/or" includes any and all combinations of one or more of the associated listed items. Expressions, such as "at least one of," when preceding a list of elements, modify the entire list of elements and do not modify the individual elements of the list.

Figure 1:
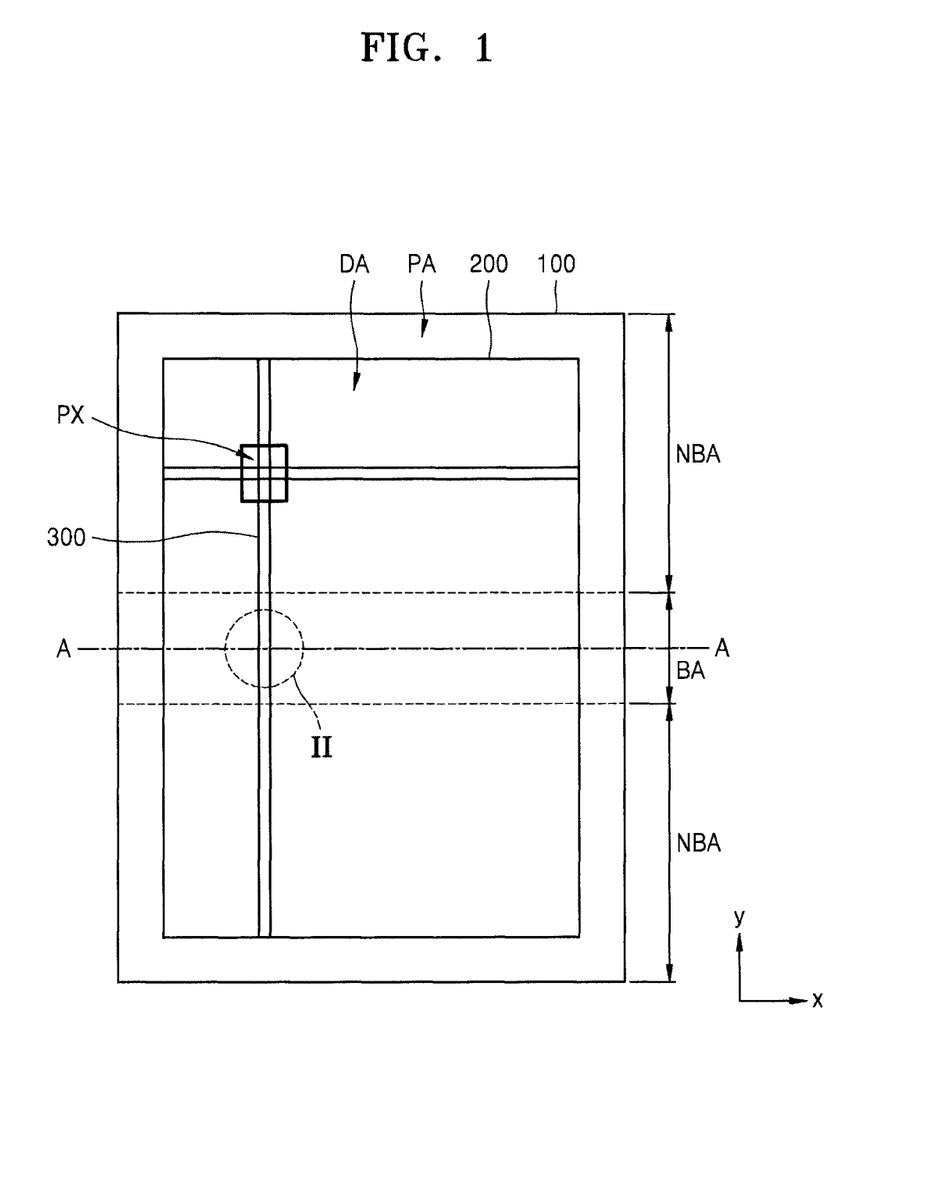
FIG. 1 is a plan view of a flexible display apparatus according to an embodiment.
Figure 2:
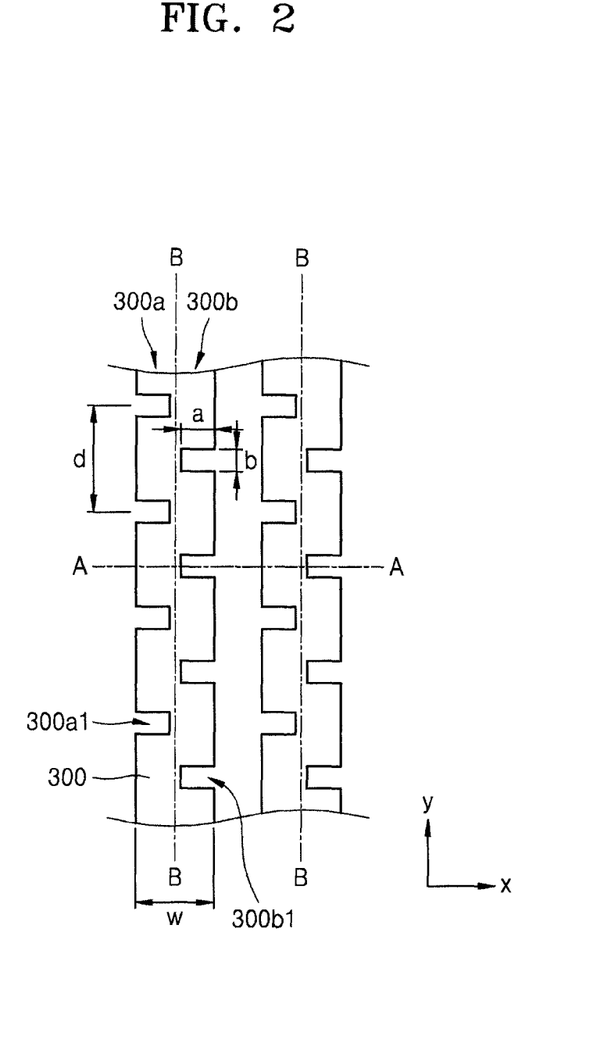
FIG. 2 is an enlarged view illustrating the portion II of FIG. 1 according to an embodiment.

FIG. 1 is a plan view of a flexible display apparatus according to an embodiment. FIG. 2 is an enlarged view illustrating the portion II of FIG. 1 according to an embodiment.

Referring to FIGS. 1 and 2, the flexible display apparatus according to an embodiment includes a flexible substrate 100 including a bending area BA and a non-bending area NBA (e.g., a rigid area), a display 200 disposed on the flexible substrate 100, and a wiring line 300 including a portion located at (e.g., extend into or across) the bending area BA.

The flexible substrate 100 may include (e.g., may be formed of) a material having relatively high thermal resistance and relatively high durability. For example, the flexible substrate 100 may include polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate, cellulose acetate propionate (CAP), poly(arylene ether sulfone), or a combination thereof. However, the inventive concept is not limited thereto, and the flexible substrate 100 may include or may be formed of any of various other materials, such as metal or glass, having flexible properties.

The flexible substrate 100 may include the bending area BA and the non-bending area NBA. The bending area BA of the flexible substrate 100 may bend along a bending axis A-A. Although the bending axis A-A extends along the X-axis to cross the display 200 in the present embodiment, a position and number of the bending axis (axes) A-A are not limited thereto, and the flexible substrate 100 may be modified in various ways.

The flexible substrate 100 may include a display area DA, at which an image is displayed and a peripheral area PA that surrounds (e.g., surrounds a periphery of) the display area DA. The display 200 may be at the display area DA of the flexible substrate 100. The display 200 may be, for example, a liquid crystal display (LCD) or an organic light-emitting display. The display 200 may include a pixel PX and a thin-film transistor (TFT) that applies an electrical signal to the pixel PX. A structure of the display 200 will be further explained below, in detail, with reference to FIG. 5.

The wiring line 300 may be disposed on the flexible substrate 100 in order to apply an electrical signal to the pixel PX of the display 200 or other components that need an electrical signal. Because the flexible substrate 100 includes the bending area BA that may bend along the bending axis A-A as described above, the wiring line 300 may include a portion located at (e.g., may extend into or across) the bending area BA. For example, the portion II of FIG. 1 corresponds to a portion of the wiring line 300 located at the bending area BA. Also, although the wiring line 300 is provided to apply an electrical signal to the pixel PX in FIG. 1, the inventive concept is not limited thereto. The wiring line 300 may be disposed at the peripheral area PA outside of the display area DA or may be located on a touch panel 400 (see FIG. 6) for sensing an external touch, instead of being on or in the display 200.

In the presently-described embodiment, the bending axis A-A of the bending area BA may extend in a first direction (e.g., the X-axis) and the wiring line 300 may extend in a second direction (e.g., the Y-axis) that crosses (e.g., intersects) the first direction. In one embodiment, the first direction and the second direction may be perpendicular to each other.

When a direction in which the bending axis A-A extends and a direction in which the wiring line 300 extends are perpendicular to each other, the wiring line 300 located at the bending area BA (e.g., the portion of the wiring line 300 at the bending area BA) is most vulnerable to stress. Many attempts have been made to reduce stress applied to the wiring line 300 located at the bending area BA. When a width of the wiring line 300 is increased in an effort to reduce stress applied thereto, an aperture ratio may decrease when the wiring line 300 is provided in the display area DA or a size of a bezel may be enlarged when the wiring line 300 is provided in the peripheral area PA. Also, when a length of the wiring line 300, instead of a width thereof, is increased to reduce stress applied thereto, a resistance of the wiring line 300 increases (e.g., unavoidably increases).

Accordingly, in the flexible display apparatus according to an embodiment, the wiring line 300 located at the bending area BA may include a plurality of recessed portions. Accordingly, the wiring line 300 (e.g., the portion of the wiring line 300) located at the bending area BA may have increased flexibility while a size of a bezel is not increased, a sufficient aperture ratio of the display area DA is ensured, and a resistance of the wiring line 300 is minimized or is not substantially increased.

FIG. 2 is an enlarged view illustrating the portion of the wiring line 300 located at the bending area BA shown in FIG. 1. Referring to FIG. 2, the wiring line 300 located at the bending area BA may include a plurality of recessed portions that are recessed in a width direction of the wiring line 300. Although the plurality of recessed portions shown in FIG. 2 have rectangular shapes, the inventive concept is not limited thereto. The plurality of recessed portions may have various shapes, such as polygonal shapes, circular shapes, elliptical shapes, partial polygonal shapes, partial elliptical shapes, or partial circular shapes.

The plurality of recessed portions may be located on both sides of the wiring line 300 in the second direction in which the wiring line 300 extends. For example, the wiring line 300 may have a central axis B-B that extends in the second direction, and the plurality of recessed portions may be located on both sides of the wiring line 300 about the central axis B-B. The central axis B-B of the wiring line 300 may also cross (e.g., intersect) the first direction.

In the presently-described embodiment, the plurality of recessed portions may include first recessed portions 300a1 and second recessed portions 300b1. The first recessed portions 300a1 may be located on a first side 300a of the wiring line 300 about the central axis B-B of the wiring line 300 that extends in the second direction, and the second recessed portions 300b1 may be located on a second side 300b of the wiring line 300 that is opposite to the first side 300a about the central axis B-B. The first recessed portions 300a1 and the second recessed portions 300b1 may be alternately located along the second direction. For example, the first recessed portions 300a1 and the second recessed portions 300b1 may be, for example, alternately arranged in a zigzag pattern along the second direction.

Because a width of the wiring line 300 at each of the first and second recessed portions 300a1 and 300b1 is reduced, a resistance of the wiring line 300 at each of the first and second recessed portions 300a1 and 300b1 may increase. If the first recessed portions and the second recessed portions are aligned with each other (e.g., are formed across from each other at the first and second sides of the wiring line), the width of the wiring line may be further reduced and the resistance of the wiring line may further increase. Accordingly, the first recessed portions 300a1 and the second recessed portions 300b1 are alternately located or arranged along the second direction.

Also, FIG. 2 illustrates a layout of the wiring line 300. Referring to FIG. 2, the wiring line 300 may have a first width w. The width of the wiring line 300 may vary according to a position and a function of the wiring line 300. For example, when the wiring line 300 is directly connected to the pixel PX, the wiring line 300 may have a relatively small width in consideration of an aperture ratio of the display area DA, and when the wiring line 300 functions as an electrode power supply line located outside of the display area DA, the wiring line 300 may have a relatively large width.

The wiring line 300 may have the first width w, and a recessed depth a of each of the first and second recessed portions 300a1 and 300b1 may be less than the first width w of the wiring line 300. In another embodiment, the recessed depth a of each of the first and second recessed portions 300a1 and 300b1 may be less than half the first width w of the wiring line 300. For example, when it is assumed that the central axis B-B is located at the center of the wiring line 300, the recessed depth a of each of the first and second recessed portions 300a1 and 300b1 may not cross (e.g., may not extend across) the central axis B-B of the wiring line 300 and may not be greater than half the first width w. As such, the resistance of the wiring line 300 at each of the first and second recessed portions 300a1 and 300b1 may not be increased or excessively increased.

Also, in the presently-described embodiment, a width b of each of the first and second recessed portions 300a1 and 300b1 is as small as possible in order to avoid or minimize an increase in a resistance of the wiring line 300. In this embodiment, the width b of each of the first and second recessed portions 300a1 and 300b1 is less than the recessed depth a of each of the first and second recessed portions 300a1 and 300b1. Accordingly, when each of the first and second recessed portions 300a1 and 300b1 has a quadrangular shape as shown in FIG. 2, each of the first and second recessed portions 300a1 and 300b1 may have a rectangular shape having the recessed depth a that is greater than the width b.

Also, in the presently-described embodiment, a minimum distance d between adjacent ones of the first recessed portions 300a1 located on the first side 300a of the wiring line 300 about the central axis B-B may be greater than the recessed depth a of each of the first recessed portions 300a1. In another embodiment, the minimum distance d between adjacent ones of the first recessed portions 300a1 located on the first side 300a of the wiring line 300 about the central axis B-B may be greater than four times the recessed depth a of each of the first recessed portions 300a1. In another embodiment, the minimum distance d between adjacent ones of the first recessed portions 300a1 located on the first side 300a of the wiring line 300 about the central axis B-B may be greater than two times the first width w of the wiring line 300.

The second recessed portions 300b1 may be formed in the same or substantially the same manner as that described above for the first recessed portions 300a1.

For example, the minimum distance d between adjacent ones of the second recessed portions 300b1 located on the second side 300b of the wiring line 300 about the central axis B-B may be greater than the recessed depth a of each of the second recessed portions 300b1. In another embodiment, the minimum distance d between adjacent ones of the second recessed portions 300b1 located on the second side 300b of the wiring line 300 about the central axis B-B may be greater than four times the recessed depth a of each of the second recessed portions 300b1. Also, in another embodiment, the minimum distance d between adjacent ones of the second recessed portions 300b1 located on the second side 300b of the wiring line 300 about the central axis B-B may be greater than two times the first width w of the wiring line 300. As such, the resistance of the wiring line 300 including the first and second recessed portions 300a1 and 300b1 may not be increased or excessively increased.

Figure 3:
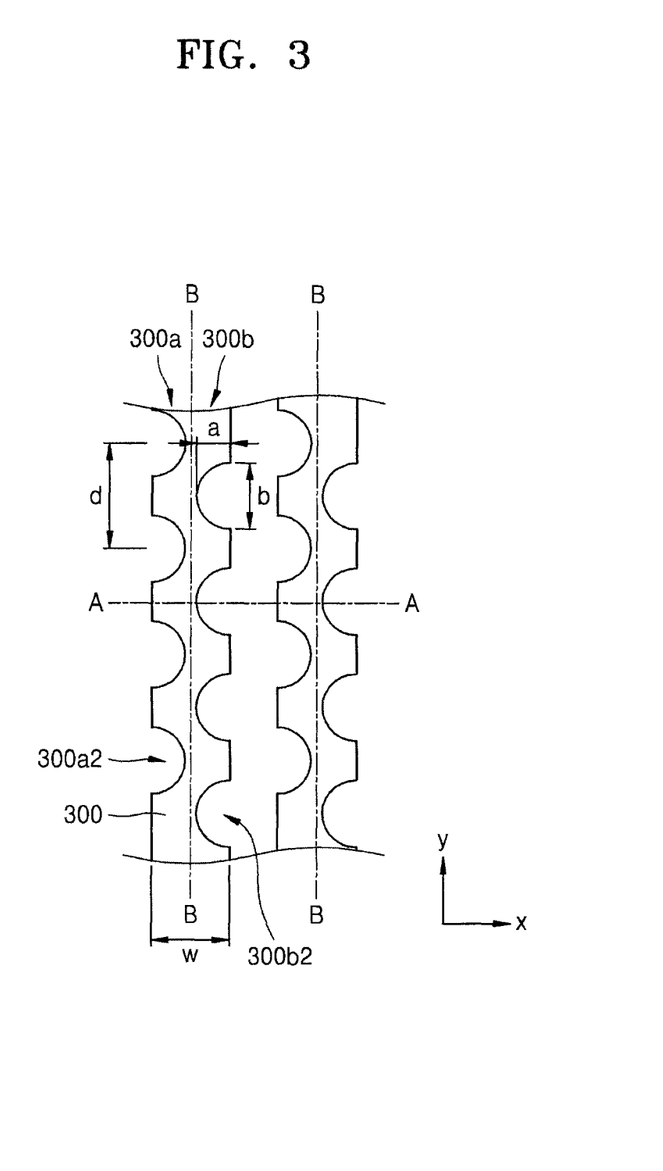
FIG. 3 is an enlarged view illustrating the portion II of FIG. 1 according to another embodiment.
Figure 4:
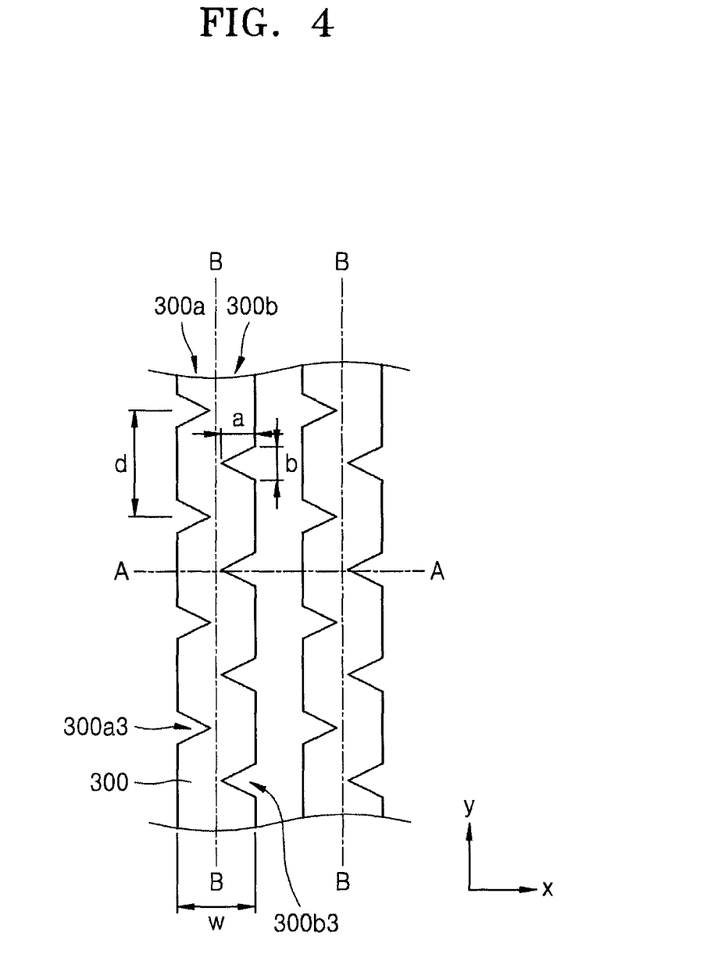
FIG. 4 is an enlarged view illustrating the portion II of FIG. 1 according to another embodiment.

FIG. 3 is an enlarged view illustrating the portion II of FIG. 1 according to another embodiment. FIG. 4 is an enlarged view illustrating the portion II of FIG. 1 according to another embodiment.

Referring to FIGS. 1 and 3, the wiring line 300 may include a plurality of recessed portions that are recessed in a width direction thereof. Although the plurality of recessed portions have circular or elliptical shapes, or partially circular or partially elliptical shapes, in FIG. 3, the inventive concept is not limited thereto. The plurality of recessed portions may have various suitable shapes in other embodiments.

The plurality of recessed portions may be located on both sides of the wiring line 300 in the second direction in which the wiring line 300 extends. For example, the wiring line 300 may have the central axis B-B that extends in the second direction, and the plurality of recessed portions may be located on both sides of the wiring line 300 about the central axis B-B. The central axis B-B of the wiring line 300 may also cross (e.g., intersect) the first direction as described above.

In the presently-described embodiment, the plurality of recessed portions may include first recessed portions 300a2 and second recessed portions 300b2. The first recessed portions 300a2 may be located on the first side 300a of the wiring line 300 about the central axis B-B of the wiring line 300 that extends in the second direction, and the second recessed portions 300b2 may be located on the second side 300b of the wiring line 300 about the central axis B-B. The first recessed portions 300a2 and the second recessed portions 300b2 may be alternately located along the second direction. For example, the first recessed portions 300a2 and the second recessed portions 300b2 may be, for example, alternately arranged in a zigzag pattern.

Because a width of the wiring line 300 at each of the first and second recessed portions 300a2 and 300b2 is reduced, a resistance of the wiring line 300 at each of the first and second recessed portions 300a2 and 300b2 may increase. If the first recessed portions and the second recessed portions are aligned with each other, a width of the wiring line may be further reduced and a resistance of the wiring line may further increase. To reduce or minimize an increase in resistance, the first recessed portions 300a2 and the second recessed portions 300b2 are alternately located or arranged along the second direction.

Also, FIG. 3 illustrates a layout of the wiring line 300. Referring to FIG. 3, the wiring line 300 may have the first width w. The width of the wiring line 300 may vary (e.g., freely vary) according to a position and a function of the wiring line 300. For example, when the wiring line 300 is directly connected to the pixel PX, the wiring line 300 may have a relatively small width in consideration of an aperture ratio of the display area DA, and when the wiring line 300 functions as an electrode power supply line located outside the display area DA, the wiring line 300 may have a relatively large width.

The wiring line 300 may have the first width w, and a recessed depth a of each of the first and second recessed portions 300a2 and 300b2 may be less than the first width w. In another embodiment, the recessed depth a of each of the first and second recessed portions 300a2 and 300b2 may be less than half the first width w of the wiring line 300. For example, when it is assumed that the central axis B-B is located at the center of the wiring line 300, the recessed depth a of each of the first and second recessed portions 300a2 and 300b2 may not cross (e.g., may not extend across or exceed) the central axis B-B of the wiring line 300 and may not be greater than half the first width w. As such, an excessive increase in a resistance of the wiring line 300 at each of the first and second recessed portions 300a2 and 300b2 may be reduced or prevented.

Also, in the presently-described embodiment, the width b of each of the first and second recessed portions 300a2 and 300b2 is as small as possible in order to reduce or avoid an excessive increase in the resistance of the wiring line 300. In one embodiment, the width b of each of the first and second recessed portions 300a2 and 300b2 is less than the recessed depth a of each of the first and second recessed portions 300a2 and 300b2, and even when the first and second recessed portions 300a2 and 300b2 are formed to have circular or semi-circular shapes as shown in FIG. 3, the width b of each of the first and second recessed portions 300a2 and 300b2 does not exceed two times the recessed depth a.

Also, in the presently-described embodiment, a minimum distance d between adjacent ones of the first recessed portions 300a2 located on the first side 300a of the wiring line 300 about the central axis B-B may be greater than the recessed depth a of each of the first recessed portions 300a2. In another embodiment, the minimum distance d between adjacent ones of the first recessed portions 300a2 located on the first side 300a of the wiring line 300 about the central axis B-B may be greater than four times the recessed depth a of each of the first recessed portions 300a2. In another embodiment, the minimum distance d between adjacent ones of the first recessed portions 300a2 located on the first side 300a of the wiring line 300 about the central axis B-B may be greater than two times the first width w of the wiring line 300.

The second recessed portions 300b2 may be formed in the same or substantially the same manner as that described above for the first recessed portions 300a2. For example, the minimum distance d between adjacent ones of the second recessed portions 300b2 located on the second side 300b of the wiring line 300 about the central axis B-B may be greater than the recessed depth a of each of the second recessed portions 300b2. In another embodiment, the minimum distance d between adjacent ones of the second recessed portions 300b2 located on the second side 300b of the wiring line 300 about the central axis B-B may be greater than four times the recessed depth a of each of the second recessed portions 300b2. Also, in another embodiment, the minimum distance d between adjacent ones of the second recessed portions 300b2 located on the second side 300b of the wiring line 300 about the central axis B-B may be greater than two times the first width w of the wiring line 300. As such, the resistance of the wiring line 300 including the first and second recessed portions 300a2 and 300b2 may not be increased or excessively increased.

Referring to FIGS. 1 and 4, the wiring line 300 located at the bending area BA may include a plurality of recessed portions that are recessed in a width direction. Although the plurality of recessed portions have triangular shapes in FIG.

4, the inventive concept is not limited thereto. The plurality of recessed portions may have various shapes.

The plurality of recessed portions may be located on both sides of the wiring line 300 in the second direction in which the wiring line 300 extends. For example, the wiring line 300 may have the central axis B-B that extends in the second direction, and the plurality of recessed portions may be located on both sides of the wiring line 300 about the central axis B-B. The central axis B-B of the wiring line 300 may also cross (e.g., intersect) the first direction as described above.

In the presently-described embodiment, the plurality of recessed portions may include first recessed portions 300a3 and second recessed portions 300b3. The first recessed portions 300a3 may be located on the first side 300a of the wiring line 300 about the central axis B-B of the wiring line 300 that extends in the second direction, and the second recessed portions 300b3 may be located on the second side 300b of the wiring line 300 about the central axis B-B. The first recessed portions 300a3 and the second recessed portions 300b3 may be alternately located along the second direction. For example, the first recessed portions 300a3 and the second recessed portions 300b3 may be, for example, alternately arranged in a zigzag pattern.

Because a width of the wiring line 300 at each of the first and second recessed portions 300a3 and 300b3 is reduced, a resistance of the wiring line 300 at each of the first and second recessed portions 300a3 and 300b3 may increase. If the first recessed portions and the second recessed portions are aligned with each other, the width of the wiring line may be further reduced and a resistance of the wiring line may further increase. To reduce or prevent an excessive increase in resistance in the wiring line 300, the first recessed portions 300a3 and the second recessed portions 300b3 are alternately located along the second direction.

Also, FIG. 4 illustrates a layout of the wiring line 300. Referring to FIG. 4, the wiring line 300 may have the first width w. The width of the wiring line 300 may vary (e.g., freely vary) according to a position and a function of the wiring line 300. For example, when the wiring line 300 is directly connected to the pixel PX, the wiring line 300 may have a relatively small width in consideration of an aperture ratio of the display area DA, and when the wiring line 300 functions as an electrode power supply line located outside of the display area DA, the wiring line 300 may have a relatively large width.

The wiring line 300 may have the first width w, and a recessed depth a of each of the first and second recessed portions 300a3 and 300b3 may be less than the first width w of the wiring line 300. In another embodiment, the recessed depth a of each of the first and second recessed portions 300a3 and 300b3 may be less than half the first width w of the wiring line 300. For example, when it is assumed that the central axis B-B is located at the center of the wiring line 300, the recessed depth a of each of the first and second recessed portions 300a3 and 300b3 may not cross (e.g., may not extend past or exceed) the central axis B-B of the wiring line 300 and may not be greater than half the first width w. As such, an excessive increase in the resistance of the wiring line 300 at each of the first and second recessed portions 300a3 and 300b3 is reduced or prevented.

Also, in the presently-described embodiment, the width b of each of the first and second recessed portions 300a3 and 300b3 is as small as possible to reduce an increase in the resistance of the wiring line 300. In one embodiment, the width b of each of the first and second recessed portions 300a3 and 300b3 is less than the recessed depth a of each of the first and second recessed portions 300a3 and 300b3.

Also, in the presently-described embodiment, a minimum distance d between adjacent ones of the first recessed portions 300a3 located on the first side 300a of the wiring line 300 about the central axis B-B may be greater than the recessed depth a of each of the first recessed portions 300a3. In another embodiment, the minimum distance d between adjacent ones of the first recessed portions 300a3 located on the first side 300a of the wiring line 300 about the central axis B-B may be greater than four times the recessed depth a of each of the first recessed portions 300a3. In another embodiment, the minimum distance d between adjacent ones of the first recessed portions 300a3 located on the first side 300a of the wiring line 300 about the central axis B-B may be greater than two times the first width w of the wiring line 300.

The second recessed portions 300b3 may be formed in the same or substantially the same manner as that described above for the first recessed portions 300a3. For example, the minimum distance d between adjacent ones of the second recessed portions 300b3 located on the second side 300b of the wiring line 300 about the central axis B-B may be greater than the recessed depth a of each of the second recessed portions 300b3. In another embodiment, the minimum distance d between adjacent ones of the second recessed portions 300b3 located on the second side 300b of the wiring line 300 about the central axis B-B may be greater than four times the recessed depth a of each of the second recessed portions 300b3. Also, in another embodiment, the minimum distance d between adjacent ones of the second recessed portions 300b3 located on the second side 300b of the wiring line 300 about the central axis B-B may be greater than two times the first width w of the wiring line 300. As such, an increase in the resistance of the wiring line 300 including the first and second recessed portions 300a3 and 300b3 may be reduced or avoided.

Figure 5:
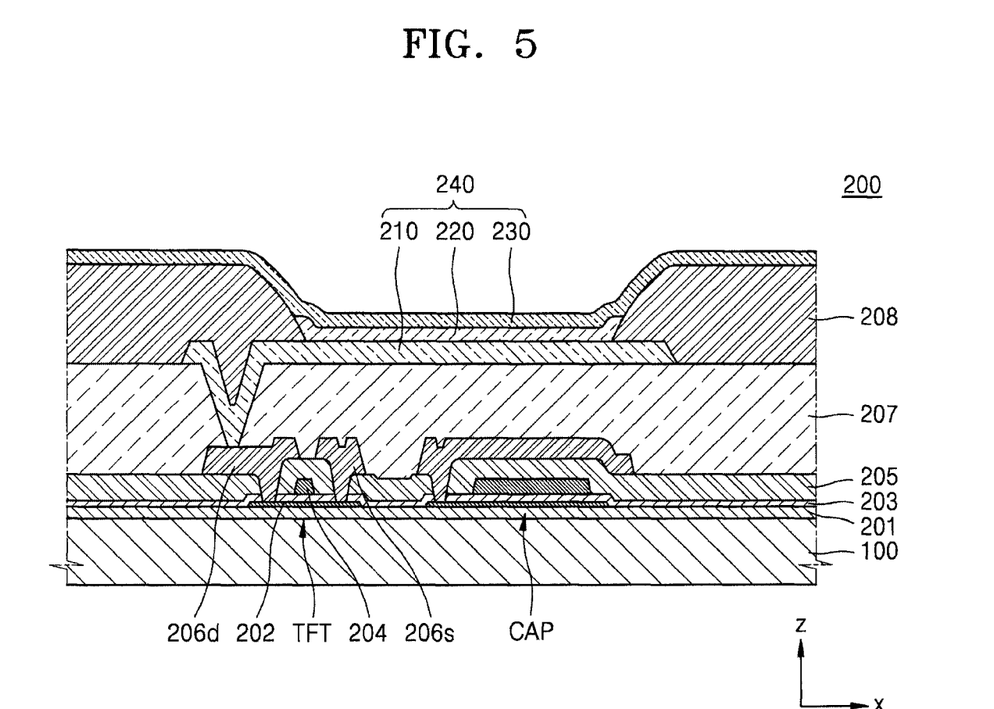
FIG. 5 is a cross-sectional view of a pixel shown in FIG. 1.

FIG. 5 is a cross-sectional view of the pixel PX shown in FIG. 1.

Referring to FIGS. 1 and 5, the display 200 may be disposed on the flexible substrate 100 and may include a plurality of the pixels PX. The display 200 may further include a TFT and a capacitor CAP electrically connected to each of the plurality of the pixels PX. FIG. 5 is a cross-sectional view of one of the pixels PX included in the display 200. The display 200 may be, for example, an LCD or an organic light-emitting display. In the presently-described embodiment, the display 200 is an organic light-emitting display.

A buffer layer 201 including (e.g., formed of) silicon oxide or silicon nitride may be disposed on the flexible substrate 100 to planarize a surface of the flexible substrate 100 and/or to prevent impurities from penetrating into a semiconductor layer 202 of the TFT, and the semiconductor layer 202 may be disposed on the buffer layer 201.

A gate electrode 204 is disposed over the semiconductor layer 202, and a source electrode 206s and a drain electrode 206d electrically communicate with each other according to a signal applied to the gate electrode 204. The gate electrode 204 may be formed to have a single-layer or may be a multi-layer structure including, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), in consideration of an adhesive force with an adjacent layer, a surface flatness of a stacked layer, and workability.

A gate insulating film 203 including (e.g., formed of) silicon oxide and/or silicon nitride may be disposed between the semiconductor layer 202 and the gate electrode 204 to insulate the semiconductor layer 202 from the gate electrode 204.

An interlayer insulating film 205 may be disposed on the gate electrode 204 and may be formed to have a single-layer or may be a multi-layer structure including a material, such as silicon oxide or silicon nitride.

The source electrode 206s and the drain electrode 206d are disposed on the interlayer insulating film 205. The source electrode 206s and the drain electrode 206d are electrically connected to the semiconductor layer 202 through contact openings (e.g., contact holes) formed in the interlayer insulating film 205 and the gate insulating film 203. The source electrode 206s and the drain electrode 206d may be formed to have a single-layer or may be a multi-layer structure including, for example, Al, Pt, Pd, Ag, Mg, Au, Ni, Nd, Ir, Cr, Li, Ca, Mo, Ti, W, and/or Cu, in consideration of conductivity.

A protective film may be disposed to cover the TFT. The protective film may include (e.g., may be formed of) an inorganic material, such as silicon oxide, silicon nitride, or silicon oxynitride.

A first insulating film 207 may be disposed over the flexible substrate 100. The first insulating film 207 may be a planarization film and/or a protective film. When an organic light-emitting device is disposed on the TFT, the first insulating film 207 may substantially planarize a top surface of the TFT and may protect the TFT and other various devices. The first insulating film 207 may include (e.g., may be formed of), for example, an acrylic organic material or benzocyclobutene (BCB). In this embodiment, as shown in FIG. 5, the buffer layer 201, the gate insulating film 203, the interlayer insulating film 205, and the first insulating film 207 may be formed over an entire surface of the flexible substrate 100.

A second insulating film 208 may be disposed over the TFT. In this embodiment, the second insulating film 208 may be a pixel-defining film. The second insulating film 208 may be on the first insulating film 207 and may have an opening. The second insulating film 208 defines a pixel region over the flexible substrate 100.

The second insulating film 208 may include (e.g., may be), for example, an organic insulating film. The organic insulating film may include an acrylic polymer, such as polymethyl methacrylate (PMMA), polystyrene (PS), a polymer derivative having a phenol group, an imide-based polymer, an aryl ether-based polymer, an amide-based polymer, a fluorine-based polymer, a p-xylene-based polymer, a vinyl alcohol-based polymer, or a mixture thereof.

An organic light-emitting device 240 may be disposed on the second insulating film 208. The organic light-emitting device 240 may include a pixel electrode 210, an intermediate layer 220 including an emission layer EML, and a counter electrode 230.

The pixel electrode 210 may be a (semi)transparent electrode or a reflective electrode. When the pixel electrode 210 is a (semi)transparent electrode, the pixel electrode 210 may include (e.g., may be formed of), for example, ITO, IZO, ZnO, $In_2O_3$, IGO, or AZO. When the pixel electrode 210 is a reflective electrode, the pixel electrode 210 may include a reflective film formed of Ag, Mg, Al, Pt, Pd, Au, Ni, Nd, Ir, Cr, or a compound thereof and a layer formed of ITO, IZO, ZnO, $In_2O_3$, IGO, or AZO. However, the inventive concept is not limited thereto, and the pixel electrode 210 may be formed of any of various suitable materials and may have any of various suitable structures, such as a single-layer structure or a multi-layer structure, and may be a transparent electrode.

The intermediate layer 220 may be disposed on the pixel region defined by the second insulating film 208. The intermediate layer 220 may include the emission layer EML that emits light in response to an electrical signal and may also include one or more of a hole injection layer (HIL) disposed between the emission layer EML and the pixel electrode 210, a hole transport layer (HTL), an electron transport layer (ETL) disposed between the emission layer EML and the counter electrode 230, and an electron injection layer (EIL), wherein the HIL, the HTL, the ETL, and the EIL may be stacked to form a multi-layer structure. However, the intermediate layer 220 is not limited thereto and may have any of various other suitable structures.

The counter electrode 230 may be disposed over the entire surface of the flexible substrate 100 to cover the intermediate layer 220 including the emission layer EML and to face the pixel electrode 210. The counter electrode 230 may be a (semi)transparent electrode or a reflective electrode.

When the counter electrode 230 is the (semi)transparent electrode, the counter electrode 230 may include a layer formed of a metal having a low work function, such as, Li, Ca, LiF/Ca, LiF/Al, Al, Ag, Mg, or a compound thereof and a (semi)transparent conductive layer formed of ITO, IZO, ZnO or $In_2O_3$. When the counter electrode 230 is the reflective electrode, the counter electrode 230 may include a layer formed of Li, Ca, LiF/Ca, LiF/Al, Al, Ag, Mg, or a compound thereof. However, a configuration and a material of the counter electrode 230 are not limited thereto and may be modified in various suitable ways.

Figure 6:
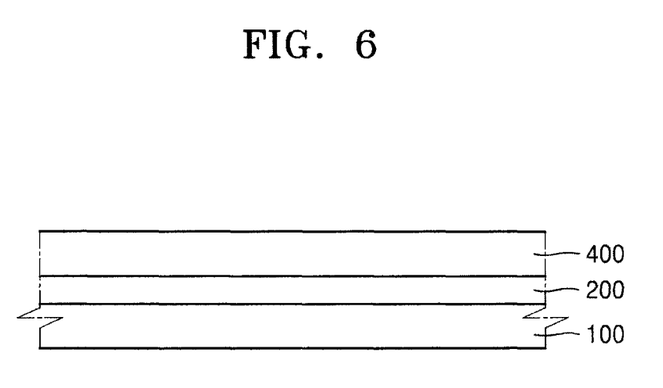
FIG. 6 is a cross-sectional view of a flexible display apparatus according to another embodiment.
Figure 7:
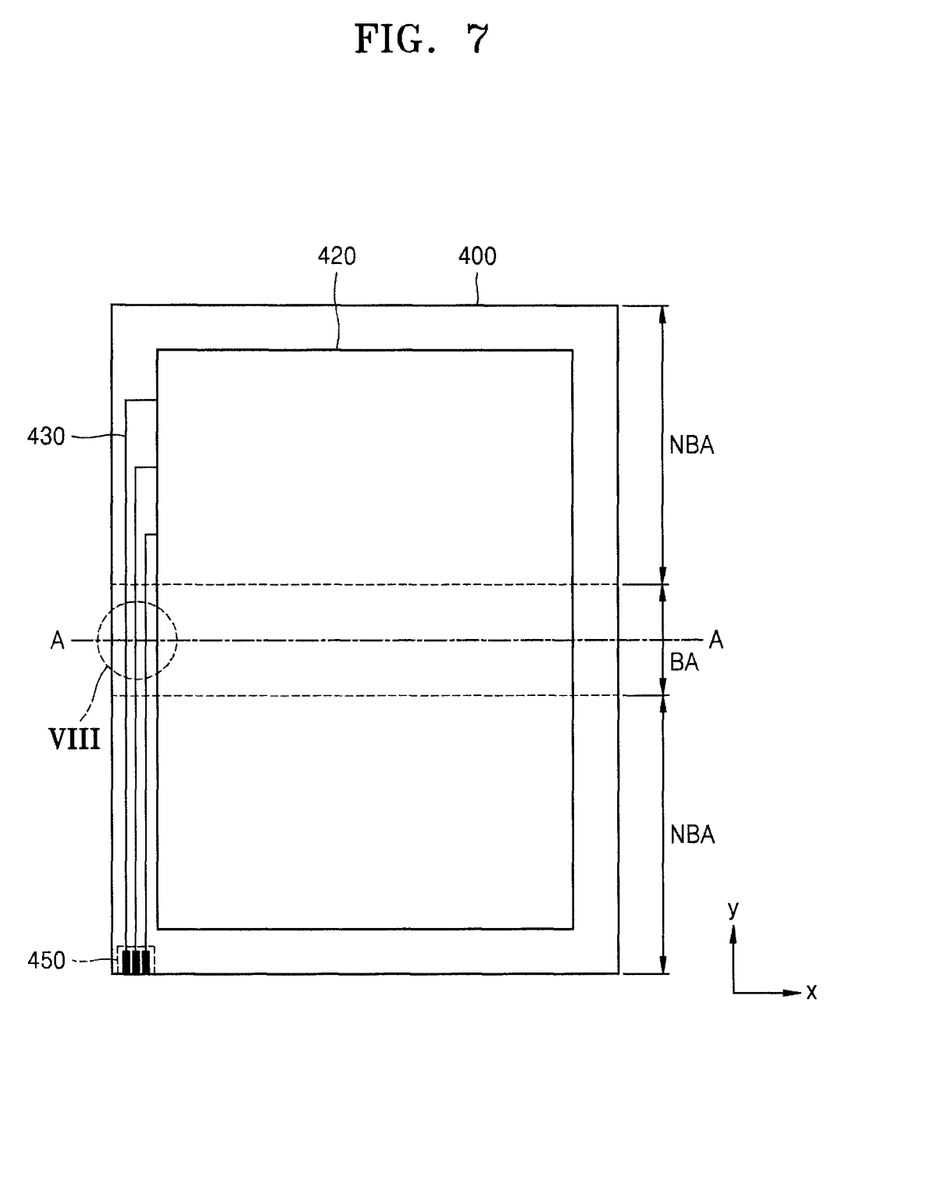
FIG. 7 is a plan view of a touch panel shown in FIG. 6.

FIG. 6 is a cross-sectional view of a flexible display apparatus according to another embodiment. FIG. 7 is a plan view of a touch panel 400 shown in FIG. 6.

Referring to FIG. 6, the flexible display apparatus according to another embodiment includes the flexible substrate 100, the display 200 disposed on the flexible substrate 100, and the touch panel 400 disposed on the display 200. The flexible substrate 100 and the display 200 are the same or are substantially the same as those described above, and thus, a repeated explanation thereof may not be given.

The touch panel 400 may be disposed on the display 200. Although the touch panel 400 is directly disposed on the display 200 in FIG. 6, any of various members or components, such as a color filter, a polarization layer, and/or a capping layer, may be disposed between the display 200 and the touch panel 400. The touch panel 400 may be formed as a module and may be disposed on the display 200 or may be integrally formed with the display 200. Although the touch panel 400 is illustrated as being formed as a module and disposed on the display 200 in the presently-described embodiment, the inventive concept is not limited thereto.

Referring to FIG. 7, the touch panel 400 may include a sensor 420 that senses an external touch and a wiring line 430 that is electrically connected to the sensor 420. The sensor 420 may be located at a central portion of the touch panel 400 to form an active area. The wiring line 430 that is connected to the sensor 420 and transmits an electrical signal may be located at an inactive area outside of (e.g., adjacent to) the sensor 420. Although the wiring line 430 is located at one side of the touch panel 400 in FIG. 7, the wiring line 430 may be located at any portion of the inactive area outside of the sensor 420. The wiring line 430 may be electrically connected to an external driving circuit, such as a position detecting circuit through a pad 450.

The touch panel 400 may be disposed over the flexible substrate 100, and in order to provide the flexible display apparatus, may include the bending area BA and the non-bending area NBA. The bending area BA may bend along the bending axis A-A. Although the bending axis A-A extends along the X-axis to cross the sensor 420 in the presently-described embodiment, a position and number of the bending axis (axes) may be changed or varied. The wiring line 430 may include a portion located at the bending area BA. For example, the portion VIII in FIG. 7 corresponds to the portion of the wiring line 430 located at the bending area BA.

In the presently-described embodiment, the bending axis A-A of the bending area BA may extend in the first direction (e.g., the X-axis), and the wiring line 430 may extend in the second direction (e.g., the Y-axis) that crosses (e.g., intersects) the first direction. In one embodiment, the first direction and the second direction may be perpendicular to each other.

When a direction in which the bending axis A-A extends and a direction in which the wiring line 430 extends are perpendicular to each other, the wiring line 430 located at the bending area BA is most vulnerable to stress. Many attempts have been made to reduce stress applied to the wiring line 430 located at the bending area BA. If a width of the wiring line 430 is increased to reduce stress applied thereto, a bezel size may increase. Also, if a length of the wiring line 430, instead of a width, is increased to reduce stress applied thereto, a resistance of the wiring line 430 increases (e.g., unavoidably increases).

Accordingly, in the flexible display apparatus according to an embodiment, the wiring line 430 located at the bending area BA may include a plurality of recessed portions. Accordingly, the flexible display apparatus includes the wiring line 430 located at the bending area BA having increased flexibility while an increase in bezel size is suppressed and an increase in a resistance of the wiring line 430 is reduced or minimized.

Figure 8:
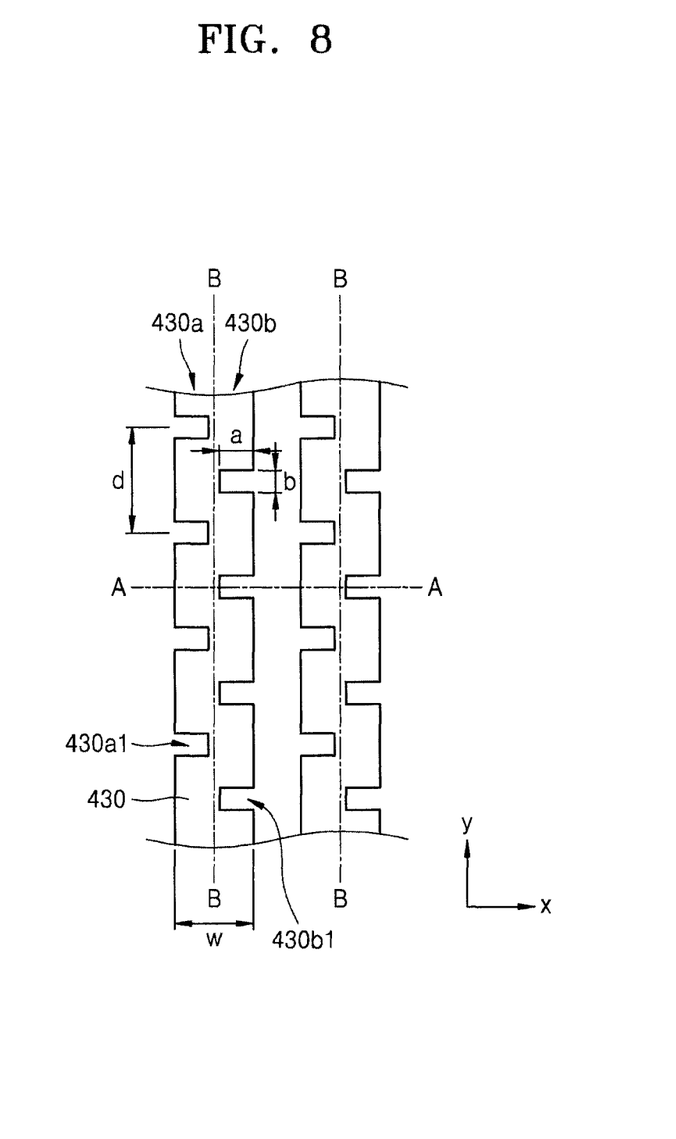
FIG. 8 is an enlarged view illustrating the portion VIII of FIG. 7.

FIG. 8 is an enlarged view of the portion VIII of FIG. 7.

Referring to FIG. 8, the wiring line 430 located at the bending area BA may include a plurality of recessed portions that are recessed in a width direction thereof. Although the plurality of recessed portions have rectangular shapes in FIG. 8, the inventive concept is not limited thereto. The plurality of recessed portions may have any of various shapes, such as polygonal shapes, circular shapes, elliptical shapes, partial polygonal shapes, partial elliptical shapes, or partial circular shapes.

The plurality of recessed portions may be located on both sides of the wiring line 430 in the second direction in which the wiring line 430 extends. For example, the wiring line 430 may have a central axis B-B that extends in the second direction, and the plurality of recessed portions may be located on both sides of the wiring line 430 about the central axis B-B. The central axis B-B of the wiring line 430 may also cross (e.g., intersect) the first direction as described above.

In the presently-described embodiment, the plurality of recessed portions may include first recessed portions 430a1 and second recessed portions 430b1. The first recessed portions 430a1 may be located on a first side 430a of the wiring line 430 about the central axis B-B of the wiring line 430 that extends in the second direction, and the second recessed portions 430b1 may be located on a second side 430b, that is, the other or opposite side, of the wiring line 430 about the central axis B-B. The first recessed portions 430a1 and the second recessed portions 430b1 may be alternately located along the second direction. For example, the first recessed portions 430a1 and the second recessed portions 430b1 may be, for example, alternately arranged in a zigzag pattern.

Because a width of the wiring line 430 at each of the first and second recessed portions 430a1 and 430b1 is reduced, a resistance of the wiring line 430 at each of the first and second recessed portions 430a1 and 430b1 may increase. If the first recessed portions and the second recessed portions are aligned with each other, the width of the wiring line may be further reduced and the resistance of the wiring line may further increase. However, to prevent an excessive reduction in the width of the wiring line 430 and a corresponding excessive increase in the resistance thereof, the first recessed portions 430a1 and the second recessed portions 430b1 are alternately located along the second direction.

Also, FIG. 8 illustrates a layout of the wiring line 430. Referring to FIG. 8, the wiring line 430 may have a first width w. A width of the wiring line 430 may vary according to a position and function of the wiring line 430.

The wiring line 430 may have the first width w, and each of the first and second recessed portions 430a1 and 430b1 may have a recessed depth a that may be less than the first width w of the wiring line 430. In another embodiment, the recessed depth a of each of the first and second recessed portions 430a1 and 430b1 may be less than half the first width w of the wiring line 430. For example, when it is assumed that the central axis B-B is located at the center of the wiring line 430, the recessed depth a of each of the first and second recessed portions 430a1 and 430b1 may not cross the central axis B-B of the wiring line 430 and may not be greater than half the first width w. As such, an excessive increase in the resistance due to the width of the wiring line 430 at each of the first and second recessed portions 430a1 and 430b1 of the wiring line 430 being decreased can be reduced or prevented.

Also, in the presently-described embodiment, a width b of each of the first and second recessed portions 430a1 and 430b1 is as small as possible to reduce or prevent an increase in the resistance of the wiring line 430. In one embodiment, the width b of each of the first and second recessed portions 430a1 and 430b1 is less than the recessed depth a of each of the first and second recessed portions 430a1 and 430b1.

Also, in the presently-described embodiment, a minimum distance d between adjacent ones of the first recessed portions 430a1 located on the first side 430a of the wiring line 430 about the central axis B-B may be greater than the recessed depth a of each of the first recessed portions 430a1. In another embodiment, the minimum distance d between adjacent ones of the first recessed portions 430a1 located on the first side 430a of the wiring line 430 about the central axis B-B may be greater than four times the recessed depth a of each of the first recessed portions 430a1. In another embodiment, the minimum distance d between adjacent ones of the first recessed portions 430a1 located on the first side 430a of the wiring line 430 about the central axis B-B may be greater than two times the first width w of the wiring line 430.

The second recessed portions 430b1 may be formed in the same or substantially the same manner as that described above for the first recessed portions 430a1. For example, a minimum distance d between adjacent ones of the second recessed portions 430b1 located on the second side 430b of the wiring line 430 about the central axis B-B may be greater than the recessed depth a of each of the second recessed portions 430b1. In another embodiment, the minimum distance d between adjacent ones of the second recessed portions 430b1 located on the second side 430b of the wiring line 430 about the central axis B-B may be greater than four times the recessed depth a of each of the second recessed portions 430b1. Also, in another embodiment, the minimum distance d between adjacent ones of the second recessed portions 430b1 located on the second side 430b of the wiring line 430 about the central axis B-B may be greater than two times the first width w of the wiring line 430. As such, an increase in the resistance of the wiring line 430 including the first and second recessed portions 430a1 and 430b1 may be reduced or avoided.

According to the one or more embodiments, a flexible display apparatus including a highly-flexible bending area may be provided. However, the scope of the inventive concept is not limited by or to this aspect.

While one or more embodiments have been described with reference to the figures, it will be understood by those of ordinary skill in the art that various changes in form and details may be made therein without departing from the spirit and scope as defined by the following claims and their equivalents.

What is claimed is:

1. A flexible display apparatus comprising:
a flexible substrate comprising a bending area and a non-bending area, the bending area being configured to bend along a bending axis; and
a wiring line extending across the bending area, a portion of the wiring line at the bending area comprising a plurality of first recessed portions and a plurality of second recessed portions, the first and second recessed portions being recessed in a width direction of the wiring line,
wherein the wiring line has a central axis that extends in a second direction, and the plurality of recessed portions are on both sides of the wiring line about the central axis,
wherein the plurality of recessed portions comprise a plurality of first recessed portions that are on one side of the wiring line about the central axis and a plurality of second recessed portions that are on another side of the wiring line about the central axis,
wherein the first recessed portions and the second recessed portions are alternately arranged along the second direction,
wherein the wiring line has a first width, the first width being a greatest width of the wiring line, and a recessed depth of each of the plurality of recessed portions is less than half the first width, and
wherein the recessed portions do not cross the central axis of the wiring line.

2. The flexible display apparatus of claim 1, wherein a width of each of the plurality of recessed portions is less than the recessed depth of each of the plurality of recessed portions.

3. The flexible display apparatus of claim 1, wherein a minimum distance between adjacent ones of the recessed portions on one side of the wiring line from among the plurality of recessed portions is greater than the first width.

4. The flexible display apparatus of claim 3, wherein the minimum distance between adjacent ones of the recessed portions on one side of the wiring line from among the plurality of recessed portions is greater than two times the first width.

5. The flexible display apparatus of claim 1, wherein the plurality of recessed portions have polygonal shapes, elliptical shapes, circular shapes, partial polygonal shapes, partial elliptical shapes, or partial circular shapes.

6. The flexible display apparatus of claim 1, further comprising a sensor configured to sense an external touch, wherein the wiring line is on a same layer as the sensor.

7. The flexible display apparatus of claim 6, wherein the wiring line is electrically connected to the sensor.

8. The flexible display apparatus of claim 6, wherein the wiring line is adjacent to the sensor.

9. The flexible display apparatus of claim 1, wherein the recessed portions on one side of the wiring line are alternately arranged with the recessed portions on another side of the wiring line along the second direction.

10. A flexible display apparatus comprising:
a flexible substrate comprising a bending area and a non-bending area, the bending area being configured to bend along a bending axis; and
a wiring line extending across the bending area, a portion of the wiring line at the bending area comprising a plurality of recessed portions recessed in a width direction of the wiring line,
wherein the wiring line has a central axis that extends in a second direction, the plurality of recessed portions are on both sides of the wiring line about the central axis, and a minimum distance between adjacent ones of the recessed portions on one side of the wiring line from among the plurality of recessed portions is greater than a recessed depth of each of the plurality of recessed portions,
wherein the wiring line has a first width, the first width being a greatest width of the wiring line, and a recessed depth of each of the plurality of recessed portions is less than half the first width, and
wherein the recessed portions do not cross the central axis of the wiring line.

11. The flexible display apparatus of claim 10, wherein the minimum distance between adjacent ones of the recessed portions on one side of the wiring line from among the plurality of recessed portions is greater than four times the recessed depth of each of the plurality of recessed portions.

12. The flexible display apparatus of claim 10, wherein the minimum distance between adjacent ones of the recessed portions on one side of the wiring line from among the plurality of recessed portions is greater than two times the first width.

13. The flexible display apparatus of claim 10, wherein the plurality of recessed portions have polygonal shapes, elliptical shapes, circular shapes, partial polygonal shapes, partial elliptical shapes, or partial circular shapes.

14. The flexible display apparatus of claim 10, further comprising a sensor configured to sense an external touch, wherein the wiring line is on a same layer as the sensor.

15. The flexible display apparatus of claim 14, wherein the wiring line is electrically connected to the sensor.

16. The flexible display apparatus of claim 14, wherein the wiring line is adjacent to the sensor.

17. The flexible display apparatus of claim 10, wherein the recessed portions on one side of the wiring line are alternately arranged with the recessed portions on another side of the wiring line along the second direction.

* * * * *